(12) United States Patent
Chiu et al.

(10) Patent No.: US 11,916,070 B2
(45) Date of Patent: Feb. 27, 2024

(54) SEMICONDUCTOR STRUCTURE WITH NANOSHEETS

(71) Applicant: TAIWAN SEMICONDUCTOR MANUFACTURING COMPANY, LTD., Hsinchu (TW)

(72) Inventors: Te-Hsin Chiu, Hsinchu (TW); Kam-Tou Sio, Hsinchu (TW); Shang-Wei Fang, Hsinchu (TW); Wei-Cheng Lin, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 250 days.

(21) Appl. No.: 17/345,452

(22) Filed: Jun. 11, 2021

(65) Prior Publication Data
US 2022/0130822 A1 Apr. 28, 2022

Related U.S. Application Data

(60) Provisional application No. 63/104,255, filed on Oct. 22, 2020.

(51) Int. Cl.
| | |
|---|---|
| *H01L 27/088* | (2006.01) |
| *H01L 29/06* | (2006.01) |
| *G06F 30/392* | (2020.01) |
| *H01L 29/78* | (2006.01) |
| *H01L 21/8234* | (2006.01) |
| *H01L 21/033* | (2006.01) |
| *H01L 29/66* | (2006.01) |

(52) U.S. Cl.
CPC ........ *H01L 27/0886* (2013.01); *G06F 30/392* (2020.01); *H01L 21/0334* (2013.01); *H01L 21/823431* (2013.01); *H01L 29/0665* (2013.01); *H01L 29/66795* (2013.01); *H01L 29/785* (2013.01); *H01L 2029/7858* (2013.01)

(58) Field of Classification Search
CPC ......... H01L 27/0886; H01L 21/823431; H01L 29/785; H01L 29/42392; H01L 29/66439; H01L 29/0673; H01L 29/775; H01L 29/78696
See application file for complete search history.

(56) References Cited

U.S. PATENT DOCUMENTS

| | | |
|---|---|---|
| 7,260,442 B2 | 8/2007 | Hwang et al. |
| 9,256,709 B2 | 2/2016 | Yu et al. |
| (Continued) | | |

OTHER PUBLICATIONS

Office Action dated May 9, 2022 for corresponding case No. TW 11120454650. (pp. 1-4).

*Primary Examiner* — Tuan A Hoang
(74) *Attorney, Agent, or Firm* — Hauptman Ham, LLP

(57) ABSTRACT

Disclosed are semiconductor devices including a substrate, a first transistor formed over a first portion of the substrate, wherein the first transistor comprises a first nanosheet stack including N nanosheets and a second transistor over a second portion of the substrate, wherein the second transistor comprises a second nanosheet stack including M nanosheets, wherein N is different from M in which the first and second nanosheet stacks are formed on first and second substrate regions that are vertically offset from one another.

20 Claims, 12 Drawing Sheets

(56) References Cited

U.S. PATENT DOCUMENTS

| | | |
|---|---|---|
| 2013/0270512 A1* | 10/2013 | Radosavljevic ...... H01L 29/775 |
| | | 438/212 |
| 2014/0040838 A1 | 2/2014 | Liu et al. |
| 2015/0069328 A1* | 3/2015 | Leobandung .......... B82Y 10/00 |
| | | 438/151 |
| 2015/0278429 A1 | 10/2015 | Chang |
| 2019/0148389 A1* | 5/2019 | Lin ....................... H01L 23/562 |
| | | 257/508 |
| 2020/0098879 A1 | 3/2020 | Lee et al. |
| 2020/0168715 A1 | 5/2020 | Wu et al. |

* cited by examiner

SEMICONDUCTOR STRUCTURE WITH NANOSHEETS

PRIORITY CLAIM

The present application claims the priority of U.S. Provisional Application No. 63/104,255, filed Oct. 22, 2020, which is incorporated herein by reference in its entirety.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers of material over a semiconductor substrate, and patterning the various material layers using lithography to form circuit components and elements thereon. As the semiconductor industry has progressed into nanometer technology process nodes in pursuit of higher device density, higher performance, and lower costs, challenges from both fabrication and design issues have resulted in the development of three-dimensional designs.

The semiconductor integrated circuit (IC) industry has experienced rapid growth. Technological advances in IC materials and design have produced generations of ICs with each generation having smaller and more complex circuits than the previous generation. The semiconductor industry progression into nanometer technology process nodes has also resulted in the development of three-dimensional designs including, for example, Gate-All-Around (GAA) devices.

Although advantages of the GAA devices include reducing short channel effects and increasing current flow, the associated fabrication processes continue to become more challenging as the feature sizes and spacing continue to decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
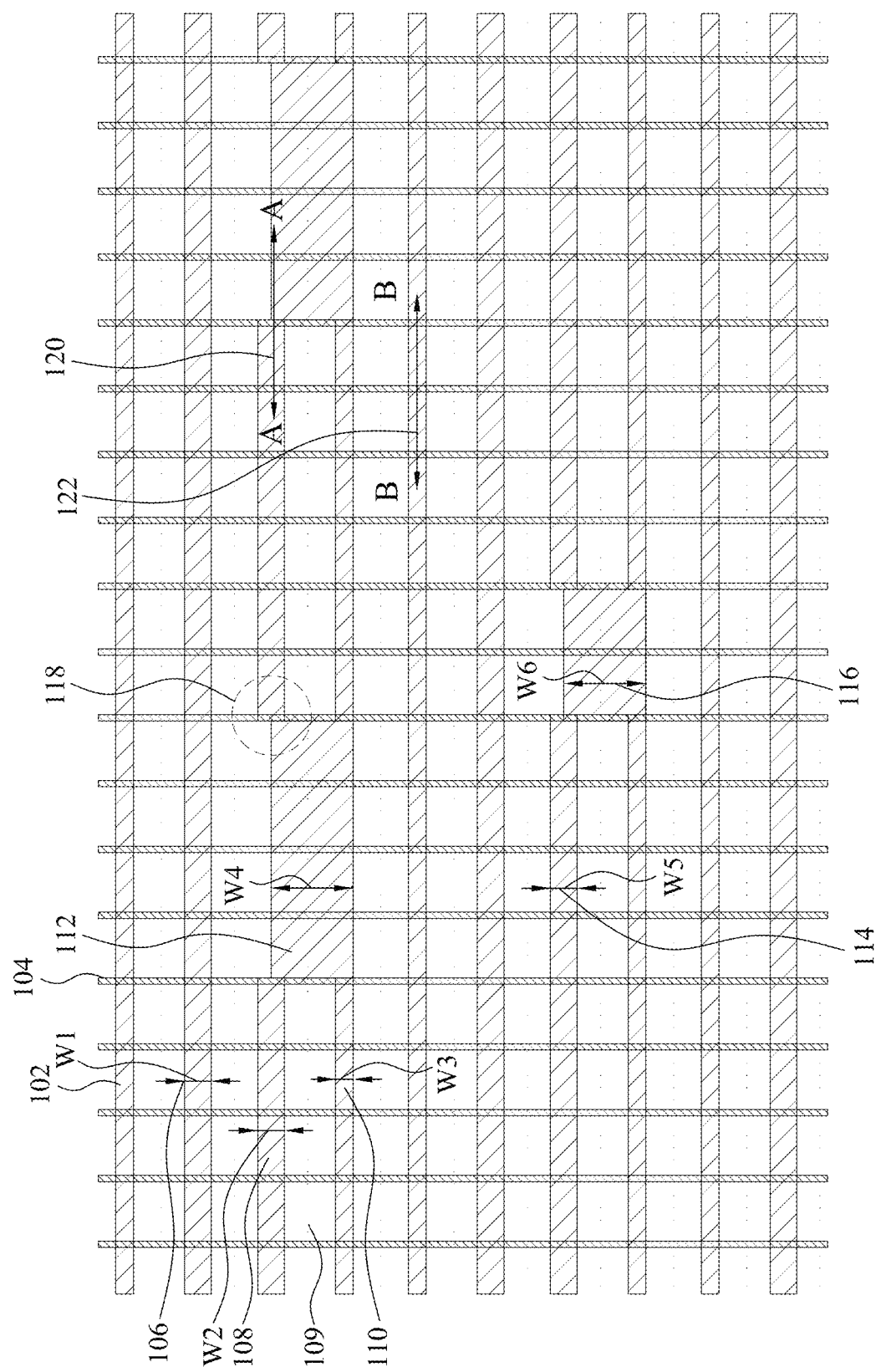
FIG. 1 is a plan of GAA transistor device structures at an intermediate manufacturing step according to some embodiments.

This description of embodiments is intended to be read in connection with the accompanying drawings, which are to be considered part of the entire written description. The following disclosure provides many different embodiments, or examples, for implementing different features of the provided subject matter. The drawings are not to scale and the relative sizing and placement of structures have been modified for clarity rather than dimensional accuracy. Specific examples of components, values, operations, materials, arrangements, or the like, are described below to simplify the present disclosure.

These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "vertical," "horizontal," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus and structures may be otherwise oriented (rotated by, for example, 90°, 180°, or mirrored about a horizontal or vertical axis) and the spatially relative descriptors used herein may likewise be interpreted accordingly.

This application relates to a semiconductor structure and more particularly to a semiconductor structure with multiple numbers and multiple widths of nanosheets incorporated in a single semiconductor structure and methods of manufacturing such semiconductor structures.

One method of improving device performance is to replace monolithic gate structures using a series of nanosheets (NS). In some semiconductor devices, the same number of NSs are utilized in a plurality of the active regions found on the entire wafer or chip. The functional semiconductor elements used for different applications, e.g., system-on-chip (SOC or SoC), central processing units (CPU), graphic processing units (GPU), and/or high-performance computing (HPC) elements, however, will utilize different number of nanosheets (NS) to achieve improvement in overall semiconductor device performance. Accordingly, utilizing a uniform number of NS across the entire chip or entire wafer limits the device flexibility and reduces the collective improvement provided by using NS and limits the gains in power, performance, area, and cost (PPAC).

The present disclosure includes various combinations of nanosheet numbers and/or nanosheet widths for different applications in a single chip or a single wafer, which aims to employ the technique of nanosheet manufacturing to provide mechanisms for adjusting power consumption, circuit matching, transistor performance, and manufacturing cost in order to meet various design specifications. These structures and methods are useful for improving the performance across different applications such SOC, CPU, GPU, or HPC, that include different functional blocks arranged across a semiconductor device.

These structures and methods disclosed herein render the power efficiency and performance for each design block adjustable. These structures and methods allow a practitioner to select a preferred combination of power efficiency and/or improved speed for different functional elements and thereby provide an overall improvement in both device performance and manufacturability.

The structures and methods detailed below relate generally to the structures, designs, and manufacturing methods for IC devices, including gate all around (GAA) transistor devices. Although the structures and methods will be discussed in terms of GAA transistor devices, the structures and methods are not so limited and are suitable for inclusion in manufacturing processes for other classes of IC devices.

FIG. 1 is a plan of GAA device structures at an intermediate manufacturing step according to some embodiments. As shown in FIG. 1, in some embodiments the IC device comprises a series of horizontal active regions 102 perpendicular to a series of vertical gate structures 104 crossing the active regions 102. In a GAA transistor, the active regions 102 define nanosheets (NS), in some embodiments. The width of the active regions 102 varies across the device with active regions having smaller widths 110 designated as W3, active regions having intermediate widths 106, 108, 114, designated as W1, W2, and W5, and active regions having larger widths 112, 116, designated as W4 and W6. In some embodiments, an active region 102 will have a single width, e.g., W1, while in other embodiments an active region will incorporate multiple widths, e.g., W2, W3, and W4 across a single active region 102.

As shown in FIG. 1, in some embodiments, the different width regions will be configured to share an aligned edge W3/W4, while in other embodiments the different width regions will be configured with an offset edge as shown in area 118 at the boundary between the W2 and W4 width active regions. In some embodiments, two or more narrow or intermediate width active regions 108, 110 are arranged as distinct and separated active regions with a field region 109 arranged in between. In some such embodiments, the two or more narrow or intermediate width active regions 108, 110 and the associated field region(s) 109 will have a cumulative width approximating that of an associated single, wider active region, 112. The flexibility of this structure allows a designer to arrange active regions 102 of varying widths across the face of the IC device and thereby match more closely the requirements of the functional block and the performance of the associated nanosheet stack.

By tailoring the performance of an associated nanosheet stack to each of the functional blocks, the designer can improve the overall performance of the finished IC device. In some embodiments, a designer will review a semiconductor device design and identify a plurality of functional blocks on a semiconductor substrate, determine an appropriate power/speed target for each of the functional blocks, e.g., slow processing and reduced power consumption for some functional blocks and faster processing and increased power consumption for some other functional blocks. The designer can then identify and assign or allocate a nanosheet stack configuration for achieving each of the power/speed targets, e.g., 1-2 nanosheet stacks for the slower processing functional blocks and 4-5 nanosheet stacks for the faster processing functional blocks. These assignments of nanosheet stacks for the different functional blocks can then be translated into semiconductor devices by preparing a stepped substrate having recessed regions with the magnitude of the recess or vertical offset corresponding to the height of the allocated nanosheet stack. In some embodiments, placing the taller nanosheet stacks in the more recessed regions of the substrate uses the stepped substrate to compensate for the height of the nanosheet stacks and produce a generally planar structure while still customizing the performance for different functional blocks.

Figure 2A:
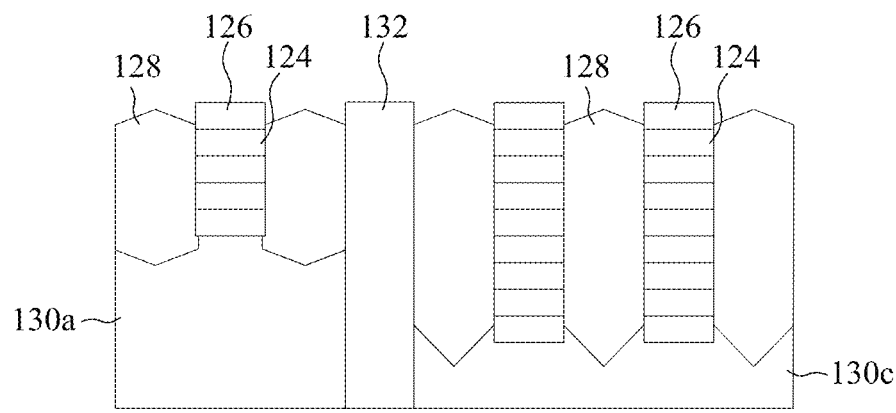
FIGS. 2A and 2B are cross-sectional views of a GAA transistor device structures of FIG. 1 according to some embodiments.
Figure 2B:
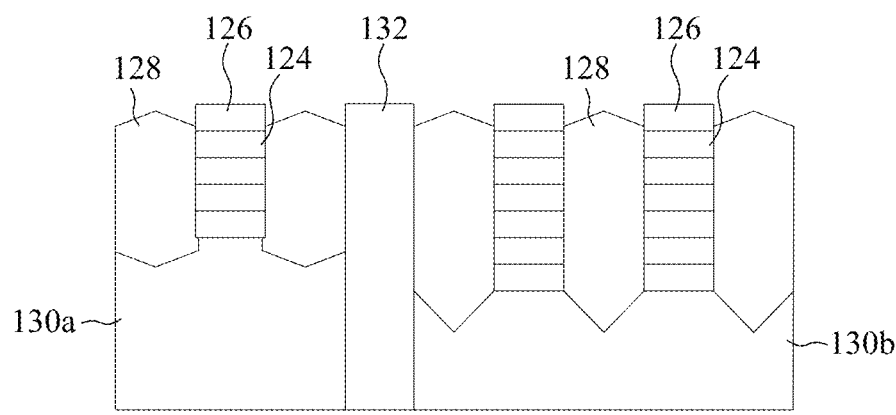

FIGS. 2A and 2B are cross-sectional views according to the GAA transistor device structures of FIG. 1 at an intermediate manufacturing step according to some embodiments. As shown in FIG. 2A, a cross-section taken along an axis A-A 120 encompasses two distinct portions of the active region in which each of the portions comprises a nanosheet stack comprising alternating layers of a semiconductor layer 124, e.g., silicon, and a gate structure layer 126. In some embodiments, the gate structure layer 126 includes a gate dielectric, such as silicon oxide, and a gate electrode, such as polysilicon, metal, or other conductive material. As shown in the two-sheet region 130a, the nanosheet stack includes two nanosheets of the semiconductor 124, alternating with three gate structure layers 126, arranged on top of a substrate with adjacent epitaxial structures 128 configured to support for the nanosheet stack.

As also shown in FIG. 2A, in the four-sheet region 130c, the nanosheet stack includes four nanosheets of the semiconductor 124, alternating with five gate structure layers 126, arranged on top of a substrate with adjacent epitaxial structures 128 configured to support the nanosheet stack. In some embodiments, an isolation structure 132, e.g., a continuous polysilicon on diffusion edge (CPODE) structure or other type of isolation structure, is arranged between the two-sheet region 130a and the four-sheet region 130c and extends to the substrate to provide electrical isolation between the two regions of the substrate.

As shown in FIG. 2B, a cross-section taken along an axis B-B 122 encompasses two distinct portions of the active region in which each of the portions comprises a nanosheet stack comprising alternating layers of a semiconductor 124, e.g., silicon, and a gate structure layer 126 in the two-sheet region 130a. The nanosheet stack includes two nanosheets of the semiconductor 124, alternating with three gate structure layers 126, arranged on top of a substrate with adjacent epitaxial structures 128 configured to support for the nanosheet stack.

As also shown in FIG. 2B, in the three-sheet region 130b, the nanosheet stack includes three nanosheets of the semiconductor 124, alternating with four gate structure layers 126, arranged on top of a substrate with adjacent epitaxial structures 128 configured to support the nanosheet stack. In some embodiments, an isolation structure 132, e.g., a CPODE structure is arranged between the two-sheet region 130a and the three-sheet region 130b and extends to the substrate to provide electrical isolation between the two regions.

Figure 3A:
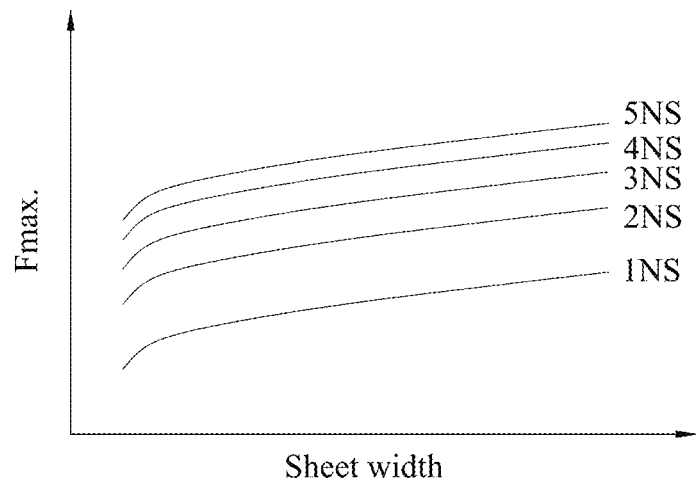
FIGS. 3A and 3B are plots reflecting the relationship between maximum frequency ($F_{max}$) and power efficiency for model device configurations using different numbers of nanosheets.
Figure 3B:
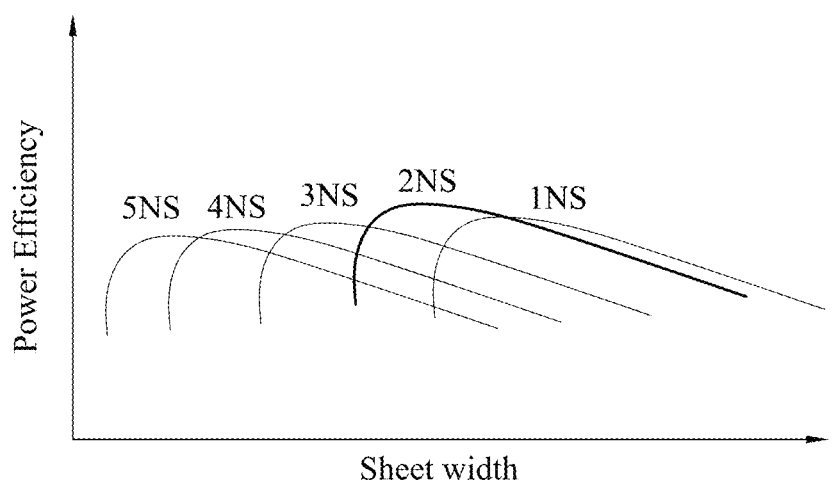

FIGS. 3A and 3B are plots reflecting a relationship between maximum frequency ($F_{max}$) and power efficiency for various target device configurations using different numbers of nanosheets in accordance with some embodiments. As shown in FIG. 3A, the maximum frequency ($F_{max}$) achieved is plotted as a function of both the sheet width and the number of nanosheets incorporated into a simulated nanosheet stack structure. As reflected in the data presented in FIG. 3A, although the $F_{max}$ increases with each additional nanosheet added to the simulated nanosheet sheet stack, as the number of nanosheets added to a functional semiconductor element increases, the improvement attributed to each successive nanosheet tends to decline, although the performance improvements achieved by increasing the width of the active region increases the IC device performance at a similar rate across each of the iterations of the nanosheet stack structures.

Turning to FIG. 3B, the power efficiency achieved is plotted as a function of both the sheet width and the number of nanosheets incorporated into a simulated nanosheet stack structure. As reflected in the data presented in FIG. 3B, increasing the nanosheet widths with each additional nanosheet added to the simulated nanosheet sheet stack, the improvement attributed to each successive nanosheet tends to decline, although the performance improvements achieved by increasing the width of the active region increases the IC device performance at a rate remains fairly constant across each of the iterations of the nanosheet stack structures. An exception to this general rule is seen when utilizing nanosheet stacks including 2 nanosheets (2 NS), a configuration which provides improved power efficiency over both nanosheet stacks including only a single nanosheet (1 NS) and nanosheet stacks including more than two nanosheets (3 NS, 4 NS, 5 NS, etc.). According to some embodiments, the functional semiconductor elements used for different applications, e.g., SOC, CPU, GPU, and/or HPC elements, however, utilize different numbers of nanosheets (NS) to provide a combination of performance and efficiency selected to provide an improved power performance area cost (PPAC) metric for the IC device or IC system as a whole.

In some embodiments, the functional semiconductor elements that operate acceptably at lower speed and lower power consumption, e.g., a SOC, will be configured with nanosheet stacks comprising 1-3 nanosheets. In some embodiments, the functional semiconductor elements that operate acceptably at medium speed and lower power consumption, e.g., a GPU, will be configured with nanosheet stacks comprising 2-4 nanosheets. In some embodiments, the functional semiconductor elements that only operate acceptably at higher speeds and, consequently, at higher power consumption levels, e.g., a CPU or a HPC, will be configured with nanosheet stacks comprising 4-5 nanosheets. By utilizing a hybrid configuration with nanosheet stacks having different numbers of nanosheets, a designer can both 1) reduce power consumption while maintaining suitable semiconductor device performance for less demanding operations and 2) maintain higher speeds (and power consumption) for more demanding operations.

Figure 4A:
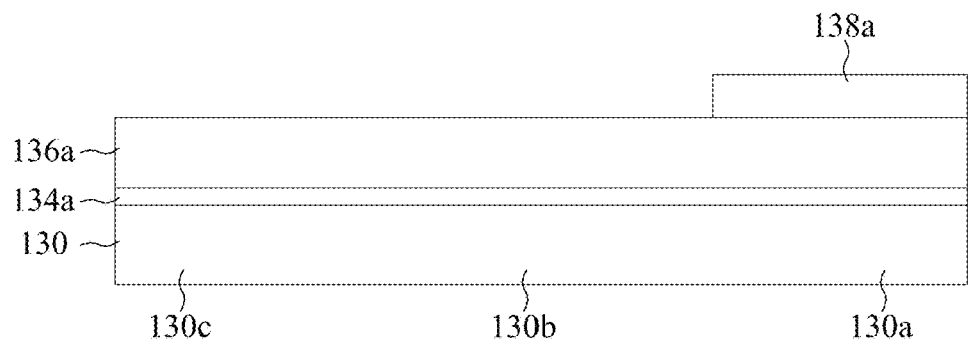
FIGS. 4A to 4K are cross-sectional views of a GAA transistor device structures at a series of intermediate manufacturing steps according to some embodiments.

FIGS. 4A to 4K are cross-sectional views of GAA transistor device structures at a series of intermediate manufacturing steps according to some embodiments. FIG. 4A is a cross-sectional view according to some embodiments in which a semiconductor substrate 130 is divided into different regions including a two-sheet region 130a, a three-sheet region 130b, and a four-sheet region 130c. The number of regions and number of sheets in each region are merely examples. One of ordinary skill in the art would understand that the current application also covers different numbers of regions and different number of sheet combinations in various embodiments. A first pad oxide layer 134a is formed on the semiconductor substrate 130 with a first hard mask layer 136a, e.g., SiN, formed on the first pad oxide layer 134a, with a first etch pattern 138a, e.g., photoresist (PR), being formed on the first hard mask layer 136a to shield a portion of the first hard mask layer 136a over the two-sheet region 130a of the substrate 130. In some embodiments, the first pad oxide layer 134a is grown by oxidizing a portion of the surface layer of the substrate 130, while in other embodiments, the first pad oxide layer 134a is deposited using a chemical vapor deposition (CVD), plasma enhanced chemical vapor deposition (PECVD), atomic layer deposition (ALD), or another process suitable for forming a suitable first pad oxide layer 134a.

Figure 4B:
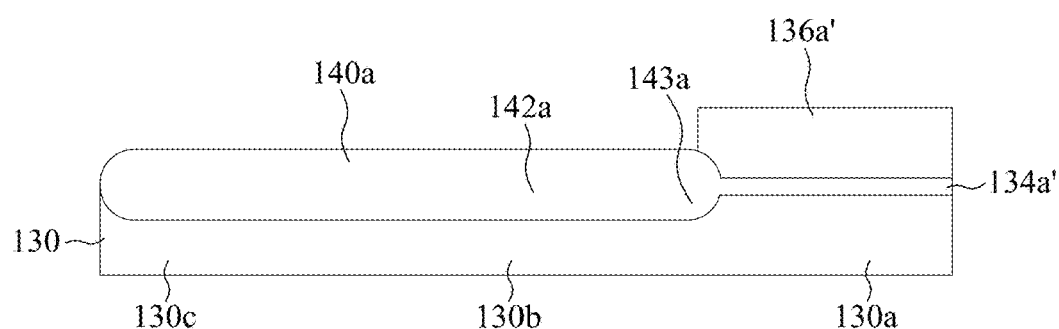

FIG. 4B is a cross-sectional view according to some embodiments at an intermediate manufacturing step after the manufacturing step shown in FIG. 4A, in which the first hard mask layer 136a has been etched, utilizing a wet or a dry etch process, using the first etch pattern 138a as an etch mask to form a first hard mask pattern 136a' over a portion of the pad oxide layer 134a', thereby exposing a portion of the first pad oxide layer 134a over the three-sheet region 130b and four-sheet region 130c of the substrate 130. A first thick oxide layer 140a is then grown in the exposed region of the pad oxide layer 134a. While growing first thick oxide layer 140a, a portion of the underlying semiconductor substrate 130 is consumed with the thickness of the substrate consumed being approximately one half of the final thickness of first thick oxide layer 140a. In some embodiments, the first thick oxide layer 140a is grown by exposing the substrate to $O_2$, water vapor (steam), other oxidizing agents and/or combinations thereof, under conditions that will oxidize an upper portion of the exposed portion of substrate 130 and, for silicon substrates, form a thick layer of silicon dioxide ($SiO_2$) 140a. The consumption of the substrate produces a substrate surface over the three-sheet region 130b and four-sheet region 130c of the semiconductor substrate 130 that has a first vertical offset 142a relative to the substrate surface over the unoxidized surface of the semiconductor substrate 130 in the two-sheet region 130a. The magnitude of the first vertical offset 142a will be approximately one half of the final thickness of the first thick oxide layer 140a. Accordingly, a designer will select the thickness of the first oxide layer so that the resulting vertical offset created by the consumption of the substrate 130 material will correspond to the height of one or more pairs of layers in the nanosheet stack (e.g., a layer of semiconductor material and a gate support layer) that will be formed on that portion of the substrate surface. By offsetting the substrate 130 surface in this manner, in some embodiments, the upper surfaces of the pairs of layers in the nanosheet stack lie in about the same plane as the upper surface of the substrate in a portion of the semiconductor device which has not been recessed to the same degree as the recessed portion where the thick oxide was formed. (see, e.g., FIG. 4H, below)

In some embodiments, the magnitude of the vertical offset (e.g., the silicon (Si) recess) will range between 10 and 60 nm, produced by growing thick oxide layers having thicknesses on the order of 20 to 120 nm, in conjunction with the subsequent depositions of the nanosheet layers, are selected so that the final nanosheet stack 150a-c heights will correspond to the vertical offset of the substrate recess in which the nanosheet stack 150a-c is formed, thereby positioning the upper surfaces of the nanosheet stack 150a-c within about 10 nm of a horizontal plane. Configuring the substrate recesses and the nanosheet stacks in this manner reduces or avoids additional planarization processes, thereby maintaining the integrity of the uppermost nanosheet in each of the nanosheet stacks and simplifying subsequent processing. In some embodiments, because the first hard mask pattern 136a' does not completely suppress oxidation near the edge of the pattern, the primary and first offset substrate surfaces will be connected by a first sloped region of the substrate 143a.

Figure 4C:
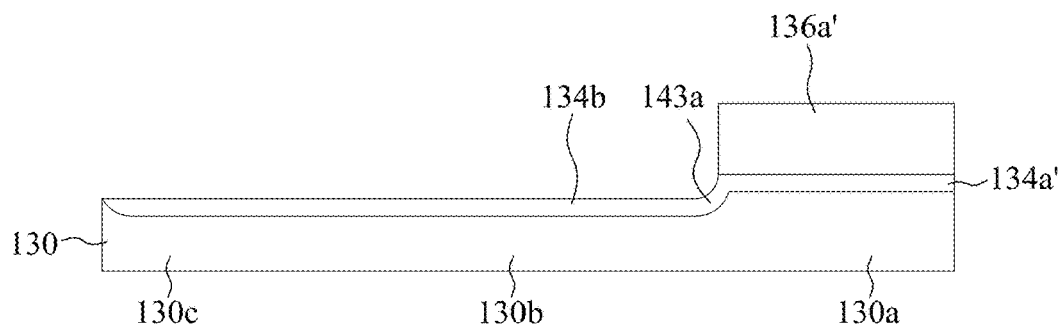

FIG. 4C is a cross-sectional view according to some embodiments at an intermediate manufacturing step after the manufacturing step shown in FIG. 4B, in which the first thick oxide layer 140a has been removed and a second pad oxide layer 134b has been formed on the surface of semiconductor substrate 130 over the three-sheet region 130b and four-sheet region 130c. In some embodiments, the first thick oxide layer 140a is removed using a blanket wet and/or dry etch process to expose a surface of the substrate 130 that was not protected by the first hard mask pattern 136a', and the second pad oxide layer 134b is formed on the newly exposed portion of the surface of the substrate 130. In some embodiments, first hard mask pattern 136a' is removed using a wet and/or dry etch process to expose the residual portion of the first pad oxide layer 134a' (not shown). The first thick oxide layer 140a and the residual portion of the first pad oxide layer 134a' are then removed using a blanket wet and/or dry etch process to expose the surface of the substrate 130, and the second pad oxide layer 134b is formed on the newly exposed surface of the substrate 130 (not shown). In some embodiments, the second pad oxide layer 134b is grown by oxidizing a portion of the surface layer of the substrate 130, while in other embodiments, the second pad oxide layer 134b is deposited using a CVD, PECVD, ALD, or another process suitable for forming a suitable second pad oxide layer 134b.

Figure 4D:
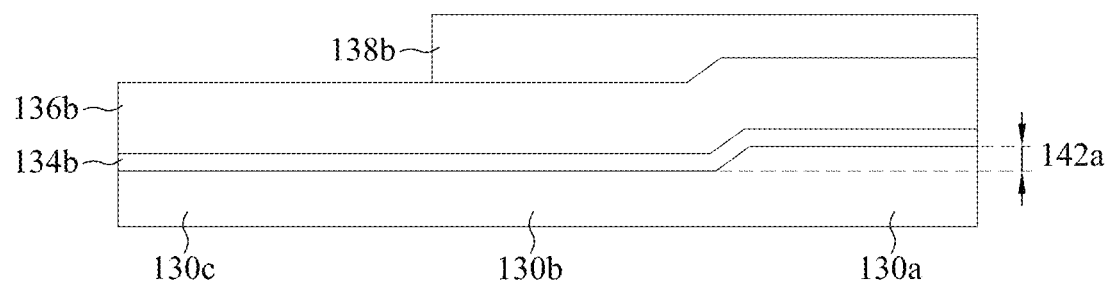

FIG. 4D is a cross-sectional view according to some embodiments at an intermediate manufacturing step after the manufacturing step shown in FIG. 4C, in which a second hard mask layer 136b has been formed over the second pad oxide layer 134b. In some embodiments, the second hard mask layer 136b is formed over the second pad oxide layer 134b and the residual portion of the first pad oxide layer 134a' after the first hard mask pattern 136a' has been removed using a wet and/or dry etch process (not shown). In yet other embodiments, the second hard mask layer 136b is formed over both the second pad oxide layer 134b and the first hard mask pattern 136a' and the residual portion of the first pad oxide layer 134a' underlying the first hard mask pattern 136a' (not shown). A second etch mask 138b is then formed on the second hard mask layer 136b over four-sheet region 130c of the substrate 130.

In some embodiments, the second hard mask layer 136b is deposited using a CVD, PECVD, ALD, or another process suitable for forming the second hard mask layer 136b, and then patterned, by depositing a layer of a photoresist composition, exposing the photoresist composition, and developing the exposed photoresist composition with the residual portions of the photoresist composition forming the second etch mask 138b. The portion of the second hard mask layer 136b exposed by the second etch mask 138b is then removed using a wet and/or dry etch process to form the second hard mask pattern 136b' and expose a portion of the substrate 130 above the four-sheet region 130c.

In some embodiments, the second etch mask 138b is a hard mask formed by depositing a layer of a hard mask material (not shown), the mask material being deposited using a CVD, PECVD, ALD, or another process suitable for forming the hard mask material layer, coating the hard mask material layer with a photoresist composition (not shown), exposing the photoresist composition using a mask or another exposure system, and developing the exposed photoresist composition whereby the residual portions of the photoresist composition form a temporary etch mask for the second etch mask 138b (not shown). The portion of the hard mask material layer exposed by the temporary etch mask is then removed using a wet and/or dry etch process to form the second etch mask 138b and expose a portion of the second hard mask layer 136b above the four-sheet region 130c. The temporary etch mask is then removed using a plasma or wet stripping process to remove any residual photoresist composition. The portion of the second hard mask layer 136b exposed by the second etch mask 138b is then removed using a wet and/or dry etch process to form the second hard mask pattern 136b' and expose a portion of the substrate 130 above the four-sheet region 130c.

Figure 4E:
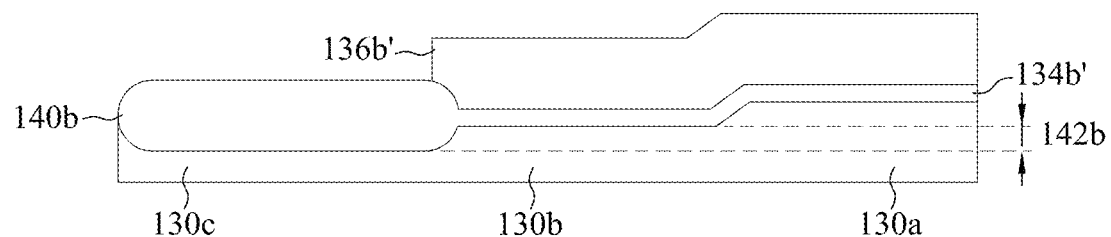

FIG. 4E is a cross-sectional view according to some embodiments at an intermediate manufacturing step after the manufacturing step shown in FIG. 4D, in which the second hard mask layer 136b has been etched, using a wet and/or dry etch process, to form a second hard mask pattern 136b' over a portion of the pad oxide layer 134b', thereby exposing a portion of the second pad oxide layer 134b over the four-sheet region 130c of the substrate 130. A second thick oxide layer 140b is then grown in the exposed region of the pad oxide layer 134b. In some embodiments, the second thick oxide layer 140b is grown by exposing the substrate 130 and/or the exposed portion of pad oxide layer 134b, to $O_2$, water vapor (steam), other oxidizing agents and/or combinations thereof, under conditions that will oxidize an upper portion of the exposed portion of substrate 130 and, for silicon substrates, form a second thick layer of silicon dioxide ($SiO_2$) 140b. In some embodiments, the exposed portion of the second pad oxide layer 134b is removed using a wet and/or dry etch in order to expose an upper surface of the substrate 130 before the second thick oxide layer 140b is grown. In some embodiments, the exposed portion of the pad oxide layer 134b is left in place and oxygen (e.g., water vapor or steam) is used to thicken the existing pad oxide layer 134b where exposed by the second hard mask layer 136b.

While growing second thick oxide layer 140b, an additional portion of the underlying semiconductor substrate 130 is consumed with the thickness of the substrate consumed being approximately one half of the final thickness of the second thick oxide layer 140b. The consumption of the substrate produces a substrate surface over the four-sheet region 130c of the semiconductor substrate 130 having a second vertical offset 142b relative to the substrate surface over the previously oxidized surface of the semiconductor substrate 130 in the three-sheet region 130b. The magnitude of the second vertical offset 142b will be approximately one half of the final thickness of the second thick oxide layer 140b. Designers can select the target thickness of the second thick oxide layer 140b to provide a vertical offset that will correspond to the extra height of the nanosheet stacks in the four-sheet region relative to the height of the shortest nanosheet stacks found on the IC device. By offsetting the height of the substrate in regions having taller nanosheet stacks, the upper surfaces of the nanosheet stacks, regardless of the number of nanosheets incorporated into respective nanosheet stacks, will tend to lie in a single plane. In some embodiments, the second vertical offset 142b is equal to the first vertical offset 142a. In some embodiments, the second vertical offset 142b is different from the first vertical offset 142a. In some embodiments, because the second hard mask pattern 136b' does not completely suppress oxidation near the edge of the pattern, the first offset and second offset substrate surfaces will be connected by a second sloped region of the substrate 143b.

Figure 4F:
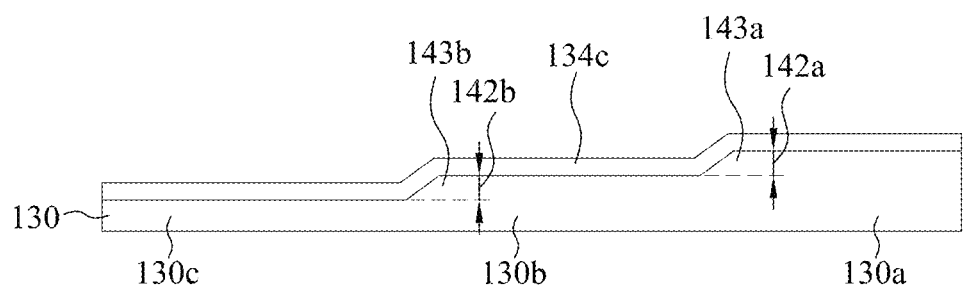

FIG. 4F is a cross-sectional view according to some embodiments at an intermediate manufacturing step after the manufacturing step shown in FIG. 4E, in which the second hard mask pattern 136b', the residual portion of the second pad oxide layer 134b' and the second thick oxide layer 140b have been removed from the semiconductor substrate 130 surface using one or more wet and/or dry etch processes to expose a stepped profile on the surface of substrate 130. In some embodiments, a third pad oxide layer 134c is then formed by oxidizing a portion of the surface layer of the substrate 130, while in other embodiments, the third pad oxide layer 134c is deposited using a CVD, PECVD, ALD, or another process suitable for forming a suitable second pad oxide layer 134b. In some embodiments, an upper portion of the second thick oxide layer 140b is removed using a blanket wet and/or dry etch process with a residual portion of the second thick oxide layer 140b forming the third pad oxide layer 134c.

Figure 4G:
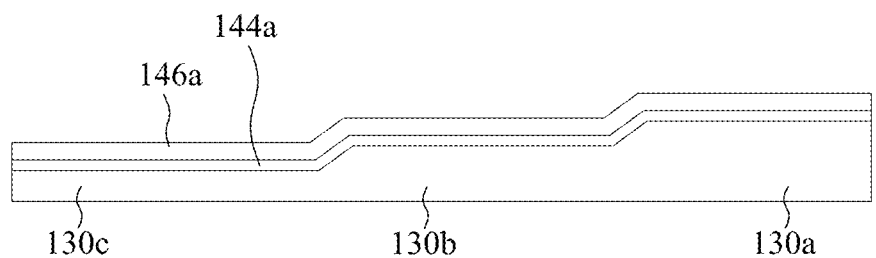

FIG. 4G is a cross-sectional view according to some embodiments at an intermediate manufacturing step after the manufacturing step shown in FIG. 4F, in which the third pad oxide layer 134c has been removed, using a wet and/or dry etch process, to expose an upper surface of the substrate 130. In some embodiments, a first nanosheet is then deposited, using an epitaxial deposition and/or another suitable deposition method, on the exposed surface of the substrate 130. In some embodiments, the first nanosheet deposition includes the deposition of a layer of a first material 144a, e.g., a first semiconductor material such as SiGe, followed by the deposition of a layer of a second material 146a, e.g., a second semiconductor material such as Si. The first material 144a and the second material 146a are selected to provide an etch differential or etch selectivity that allows for the removal of the first material during a subsequent manufacturing step while leaving a majority or a significant portion of the layer of the second material. In some embodiments, a subsequent channel open etch removes the layer(s) of the first material 144a from between the alternating portions of the second material 146a (not shown). In some embodiments, a gate dielectric structure (not shown), e.g., an oxide, and a gate conductor structure, e.g., a metal gate, are then formed on and between the residual portions of the second material layer(s) 146a using, e.g., an ALD process, in the opening formed by removing the first material 144a.

In some embodiments utilizing SiGe as the first material 144a, the Ge content of the layer is keep low in order to reduce lattice distortion and other defects associated with the crystalline misalignment and/or other defects at the interface between the dissimilar layers of the first material 144a and the second material 146a. In some embodiments utilizing SiGe as the first material 144a, the germanium content of the SiGe layers is increased to provide an improved etch differential between the dissimilar layers of the first material 144a and the second material 146a in order to improve the removal of the layer of the first material 144a while suppressing any increase in the defects at the interface between the alternating layers of the first material 144a and the second material 146a. In some embodiments, those skilled in the art set a target Ge content of the first material 144a that provides an acceptable etch differential relative to the second material 146a while still suppressing or limiting interfacial defects. In some embodiments where the first material is silicon germanium (SiGe), the germanium has a mole fraction of not less than 0.15 and not more than 0.8, although other mole fractions of Ge are also within the scope of the present disclosure.

Figure 4H:
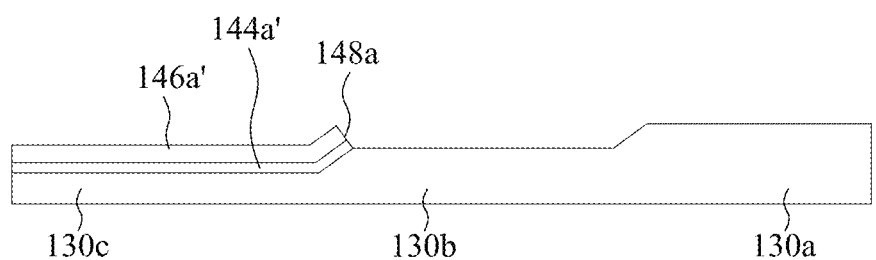

FIG. 4H is a cross-sectional view according to some embodiments at an intermediate manufacturing step after the manufacturing step shown in FIG. 4G, in which the first nanosheet deposition has been patterned (not shown) and etched, utilizing a wet and/or dry etch process, to remove the first nanosheet deposition from those regions of the semiconductor substrate 130 designated as the two-sheet region 130a and three-sheet region 130b. Residual portions of the first material 144a' and the second material 146a' will remain on the surface of the semiconductor substrate 130 above the four-sheet region 130c. Depending on the configuration of the etch mask (not shown), in some embodiments a sloped portion 148a of the residual first and second materials cover the second sloped region of the substrate 143b while in some embodiments, the configuration of the etch mask (not shown) exposes the region of the first and second materials covering the second sloped region of the substrate 143b (not shown) so that surface of the substrate 130 will be exposed on the second sloped region 143b.

In some embodiments, the thickness of the deposited layer of the first material 144a corresponds to a nanosheet separation (NSS) range of 10-20 nm, a range which provides both sufficient separation of the nanosheets, processing margins for layer uniformity, and, after removal, space for the formation of the gate structures while not unduly increasing the time and expense of the associated deposition, etch, and removal processes. In some embodiments, the thickness of the deposited layer of the second material 146a corresponds to a nanosheet height (NSH) range of 10-20 nm, a range which provides sufficient mechanical strength for the nanosheets to be self-supporting after the layers of the first material have been removed while not unduly increasing the time and expense of the associated deposition and etch processes. In some embodiments, the ratio of the thicknesses of the deposited layers of the first and second materials 144a, 146a (NSS:NSH) ranges from 2:1 to 1:2 with the relative dimensions being selected so that the final nanosheet stack 150a-c height will correspond to the vertical offset of the substrate recess in which the nanosheet stack 150a-c is formed, sufficient mechanical strength is maintained during formation of the GAA structure, and adjusts the time and expense devoted to the deposition and etch of each of the layers. In some embodiments the NSH dimension is selected to provide layers having sufficient thickness to tolerate thickness variations across a substrate and to provide sufficient strength for the subsequent processing, e.g., the removal of the first material to leave cantilevered or bridging regions of the second material while also not unnecessarily extending the deposition (and subsequent etch processes) without corresponding functional benefits to the IC device.

Figure 4I:
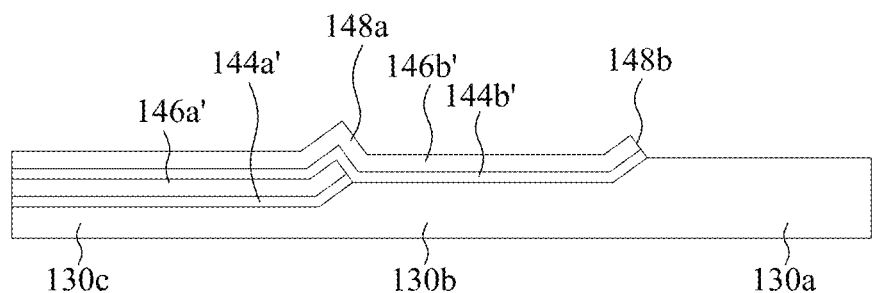

FIG. 4I is a cross-sectional view according to some embodiments at an intermediate manufacturing step after the manufacturing step shown in FIG. 4H, in which a second nanosheet has been deposited on the exposed surface of the semiconductor substrate 130 and the residual portion of the first nanosheet. The second nanosheet deposition includes a layer of the first material 144b, e.g., SiGe, and a layer of the second material 146b. The first and second materials 144b, 146b are selected to provide an etch rate differential, or etch selectivity, sufficient to allow subsequent removal of the first material 144b while retaining the second material 146b. The second nanosheet deposition has been patterned (not shown) and etched to remove the second nanosheet deposition from those regions of the semiconductor substrate 130 designated as the two-sheet region 130a.

Residual portions of the first material 144b' and the second material 146b' from the second nanosheet deposition remain on the surface of the semiconductor substrate 130 above the three-sheet region 130b and on the residual portions 144a', 146a' of the first nanosheet deposition above the four-sheet region 130c. Depending on the configuration of the etch mask (not shown), a sloped portion 148b of the residual first and second materials may cover the first sloped region of the substrate 143a while in some embodiments, the configuration of the etch mask (not shown) exposes the region of the first and second materials covering the first sloped region of the substrate 143a (not shown) to that surface of the substrate 130 will be exposed on the first sloped region of the substrate 143a. In some embodiments, each of the nanosheet depositions incorporates the same first and second materials and the same or at least similar thicknesses. In other embodiments, at least one of the first and/or second material layers comprises at least one different material and/or at least one different thickness.

Figure 4J:
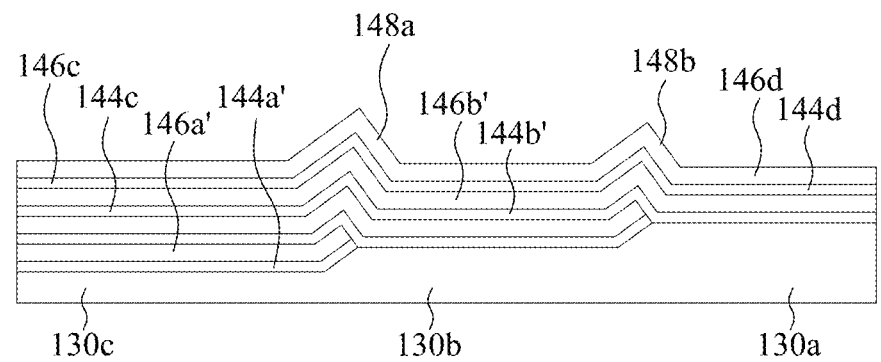

FIG. 4J is a cross-sectional view according to some embodiments at an intermediate manufacturing step after the manufacturing step shown in FIG. 4I, in which a third and a fourth nanosheet have been deposited on the exposed surface of the semiconductor substrate 130 and the residual portion of the first nanosheet. The third nanosheet deposition includes a layer of the first material 144c, e.g., SiGe, and a layer of the second material 146c. The first and second materials 144c, 146c are selected to provide an etch rate differential or etch selectivity sufficient to allow subsequent removal of the second material 146c while retaining the first material 144c. The fourth nanosheet deposition includes a layer of the first material 144d, e.g., SiGe, and a layer of the second material 146d. The first and second materials 144d, 146d are selected to provide an etch rate differential or etch selectivity sufficient to allow subsequent removal of the second material 146d while retaining the first material 144d. According to some embodiments, the relative thicknesses of the first and second materials used in the nanosheet depositions are uniform while, in other embodiments, the relative thicknesses of the first and second layers comprising at least one nanosheet deposition are different from another nanosheet deposition. In some embodiments, the relative thickness of the first material layer may vary among a series of nanosheet depositions.

In some embodiments, the first material 144a-d has an etch rate $R_1$ and the second material 146a-d has a second etch rate $R_2$, wherein $R_1$ and $R_2$ satisfy a relationship $R_1 >> R_2$. This etch rate selectivity, or the difference in the response of the first and second materials to an etch process, allows the layers of the first material to be removed while maintaining the layers of the second material.

The configuration of the nanosheet stacks according to some embodiments will incorporate certain target dimensions as reflected below in Table 1. According to some embodiments, the Si recess/vertical offset dimension is set for each of the recessed regions of the semiconductor substrate 130 to correspond to the height of the nanosheet stack that is formed on that substrate surface with a larger vertical offset being used for taller/higher NS nanosheet stacks and improve the final planarity of the resulting nanosheet stacks. The number of nanosheets incorporated into a given nanosheet stack will correspond to the operational demands of the functional element incorporating that nanosheet stack with higher numbers of NS being utilized for more demanding processing applications. As reflected in FIG. 3A, because the relative improvement decreases for each successive NS added to the nanosheet stack, a total of five NS in a high performance nanosheet stack provides the desired performance while avoiding the need for additional processing time and expense. According to some embodiments, the nanosheet height and nanosheet separation ranges are intended to provide layers having sufficient thickness to be tolerant of thickness variations across a substrate and to provide sufficient strength to tolerate additional processing, e.g., the removal of the second material to leave cantilevered or bridging regions of the first material while also not unnecessarily extending the deposition (and subsequent etch processes) without corresponding functional benefits to the IC device. The nanosheet width range is selected to provide designers additional latitude for controlling the operation of the resulting device with respect to current demands and/or resistance heating while still operating in the dimensional range of adjacent structures for meeting design rule dimensional requirements and simplifying processing.

TABLE 1

| Structure | Range |
| --- | --- |
| Si Recess/Vertical Offset | 10-60 nm |
| Number of NS | 1-5 |
| Nanosheet Height (NSH) | 10-20 nm |
| Nanosheet Spacing (NSS) | 10-20 nm |
| NSH/NSS Ratio | 2:1 to 1:2 |
| Nanosheet width (NSW) | 15-70 nm |

Figure 4K:
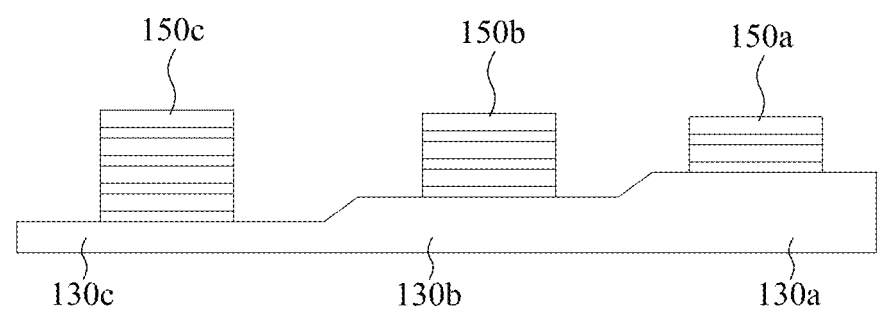

FIG. 4K is a cross-sectional view according to some embodiments at an intermediate manufacturing step after the manufacturing step shown in FIG. 4J, in which the accumulated nanosheet depositions 144a-d, 146a-d have been patterned (not shown) and etched to produce a plurality of nanosheet stacks. In some embodiments, the nanosheet depositions 144a-d, 146a-d are patterned by depositing a layer of a photoresist composition (not shown), exposing the photoresist composition using a mask (or reticle), and developing the exposed photoresist composition with the residual portions of the photoresist composition forming the nanosheet stack etch mask (not shown). The portion of the nanosheet depositions exposed by the nanosheet stack etch mask is then removed using a wet and/or dry etch process to form the nanosheet stacks 150a-c. The dimensions of the nanosheet etch mask will determine the width of the nanosheet stack which, in some embodiments, will range between 15 and 70 nm, a range that provides the designer with an additional means for setting the performance of a particular nanosheet stack 150a-c, while limiting the surface area consumed and staying within the performance limits of the imaging systems used in forming the nanosheet etch mask.

In some embodiments, the nanosheet stack etch mask (not shown) is a hard mask formed by depositing a layer of a hard mask material (not shown), the hard mask material being deposited using a CVD, PECVD, ALD, or another process suitable for forming the hard mask material layer, coating the hard mask material layer with a photoresist composition (not shown), exposing the photoresist composition using a mask or another exposure system, and developing the exposed photoresist composition whereby the residual portions of the photoresist composition form a temporary etch mask for the nanosheet stack etch mask (not shown). The portion of the hard mask material layer exposed by the temporary etch mask is then removed using a wet and/or dry etch process to form the nanosheet stack etch hard mask (not shown) and expose a portion of the nanosheet depositions 144a-d, 146a-d. In some embodiments, the temporary etch mask is then removed using a plasma or wet stripping process for removing organic materials from the surface of the substrate. The portion of the nanosheet depositions exposed by the nanosheet stack etch hard mask is then removed using a wet and/or dry etch process to form the nanosheet stacks 150a-c. In some embodiments, the temporary etch mask is then removed after formation of the nanosheet stacks 150a-c using a plasma or wet stripping process to remove any residual photoresist composition. The residual portions of the nanosheet stack etch hard mask are then removed using a wet and/or dry etch to expose upper surfaces of nanosheet stacks 150a-c (not shown).

As a result of the partial nanosheet deposition layers retained on the recessed surfaces of the substrate, the resulting nanosheet stacks comprise different numbers of nanosheet layers with the nanosheet stack 150c above the four-sheet region 130c comprising eight alternating layers of the first material and the second material, the nanosheet stack 150b above the three-sheet region 130b comprising six alternating layers of the first material and the second material, and the nanosheet stack 150a above the two-sheet region 130a comprising four alternating layers of the first material and the second material. According to some embodiments, by adjusting the heights of the nanosheet stacks to correspond to the vertical offset of the substrate surface on which the nanosheet stacks are formed, the upper surfaces of the nanosheet stacks 150a, 150b, 150c, lie in or near a single horizontal plane that will simplify subsequent processing steps.

The ability to provide nanosheet stacks comprising different numbers of nanosheets on a single substrate provides device designers with increased flexibility to utilize a variety of nanosheet stacks for better matching the performance demands of different functional elements arranged on a single substrate. For example, functional elements that do not entail high speed processing can incorporate nanosheet stacks having fewer nanosheets, thereby decreasing power consumption while simultaneously incorporating nanosheet stacks having higher numbers of nanosheets to improve the performance of those functional elements processing demanding tasks. The coordination of the nanosheet stack configuration and the functional elements according to some embodiments is reflected below in Table 2.

TABLE 2

| App/Function | Speed Target | Power Consumption | Number of NS |
|---|---|---|---|
| Low Power/SoC | Low | Low | 1-3 |
| GPU | Medium | Medium | 2-4 |
| CPU | High | High | 4-5+ |
| Server/HPC | High/V High | High/V High | 4-5+ |

Figure 5:
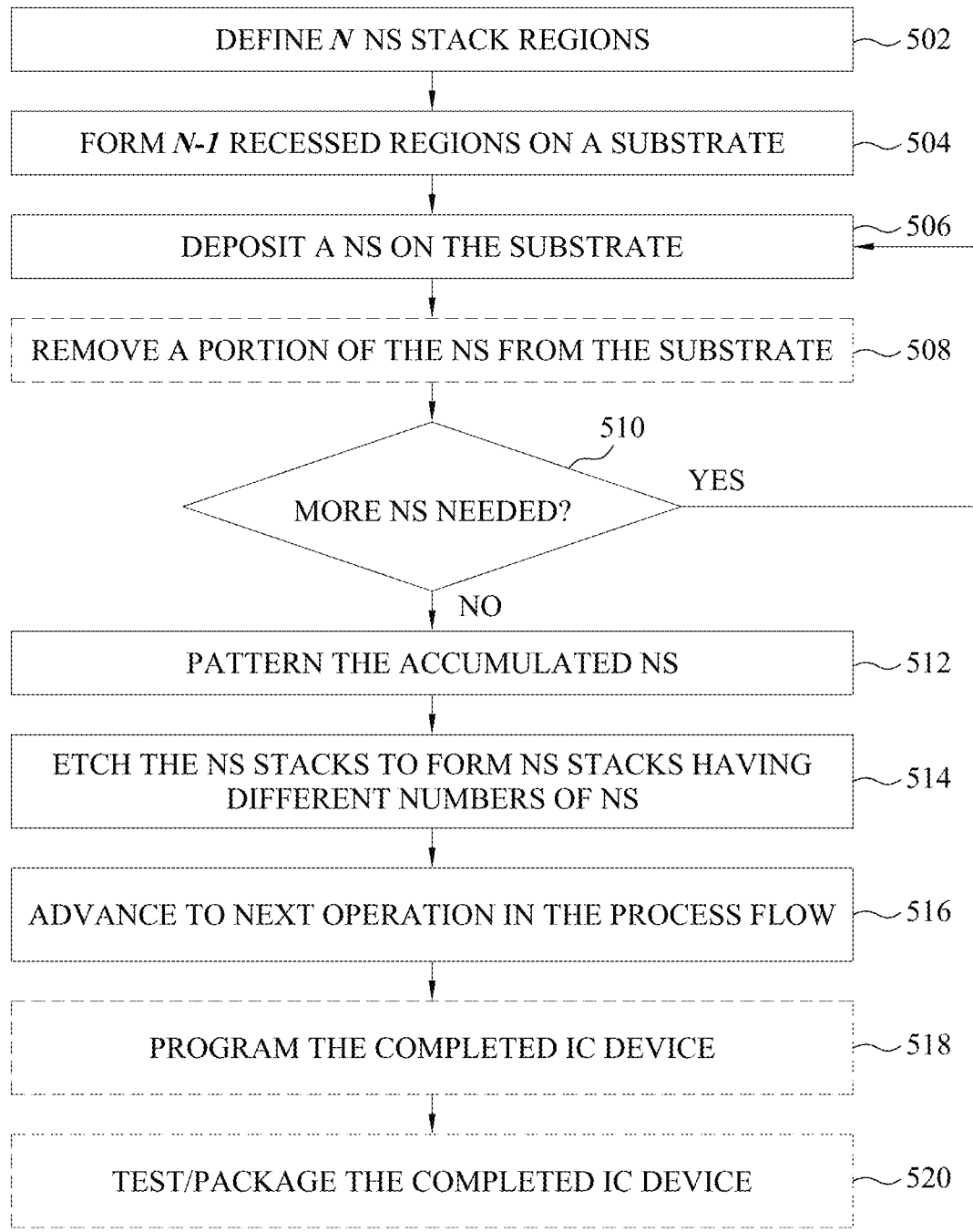
FIG. 5 is a flowchart of a method of manufacturing a GAA transistor device according to some embodiments.

FIG. 5 is a flowchart of a method 500 of manufacturing a GAA device according to some embodiments that includes, in order, the operations of defining a plurality of N nanosheet stack regions on a substrate, operation 502. Some embodiments of the method 500 will generally correspond to the manufacturing sequence illustrated in FIGS. 4A-4K for forming a GAA device. Each of the N nanosheet stack regions will accommodate nanosheet stack structures 150a-c incorporating a different number of nanosheets. The designer will determine both the number of different nanosheet stack structures and the number of nanosheets incorporated in the respective nanosheet stack structures based on the IC device design with functional semiconductor elements that operate at lower speed and lower power consumption, e.g., a SOC, being allocated to shorter height nanosheet stacks comprising 1-3 nanosheets, functional semiconductor elements that operate at medium speed and lower power consumption, e.g., a GPU, being allocated to intermediate height nanosheet stacks comprising 2-4 nanosheets, and functional semiconductor elements that only operate at higher speeds and, consequently, at higher power consumption levels, e.g., CPUs and HPCs, being allocated to the taller nanosheet stacks comprising 4-5 nanosheets.

Once the nanosheet stack regions are defined, a plurality of N-1 recessed regions are formed on the substrate, operation 504. In some embodiments, the recessed regions are formed by masking a region of the semiconductor substrate 130 and then growing a thick oxide layer 140a, 140b on an exposed region of the semiconductor substrate 130. The growth of the thick oxide layers 140a, 140b consumes a portion of the substrate 130 underlying the thick oxide layers 140a, 140b. In some embodiments, after the thick oxide layers 140a, 140b, have been removed, the remaining substrate 130, has a stepped profile with surfaces in which each of the N-1 recessed regions has a vertical offset relative to the original surface of the substrate 130 which was not subjected to the formation of a thick oxide layer. In some embodiments, the N-1 recessed regions, in combination with a non-recessed region, correspond to the previously defined plurality of N nanosheet stack regions. In some embodiments, the thickness of the thick oxide layers are selected whereby the vertical offset of the N-1 recessed regions allows the upper surfaces of the nanosheet stacks 150a-c to lie within about ±10 nm of a single horizontal plane.

Once the substrate has been modified to include the plurality of N-1 recessed regions, a series of nanosheet layers can then be deposited on the substrate, operation 506, with a portion of at least some of the nanosheet layers being removed prior to the deposition of a next nanosheet layer, operation 508. In some embodiments, after the stepped substrate 130 has been formed, a first nanosheet is then deposited, using an epitaxial deposition and/or another suitable deposition method, on the exposed surface of the substrate 130. In some embodiments, the first nanosheet deposition includes the deposition of a layer of a first material, e.g., SiGe, followed by the deposition of a layer of a second material, e.g., Si. In some embodiments, the first nanosheet deposition is then patterned and etched, utilizing a wet and/or dry etch process, to remove the first nanosheet deposition from those regions of the semiconductor substrate 130 designated for lower height nanosheet stacks. Residual portions of the first and second materials will remain on the surface of the semiconductor substrate 130 above the regions designated for intermediate and taller height nanosheet stacks. This sequence of nanosheet deposition and, partial removal with respect to those regions of the substrate 130 in which a shorter and/or intermediate height nanosheet stacks will be formed, continues until a desired number of nanosheets have been deposited in each of the N nanosheet stack regions, operation 510.

After the desired number of partial and full nanosheet layers has been deposited, the stacks of nanosheet layers can be patterned, operation 512, and etched, operation 514, using a wet or a dry etch to form a series of N nanosheet stacks having both the number of incorporated nanosheets and the width of the nanosheet stack corresponding to the requirements of a particular functional element as determined by the designer.

Once the nanosheet stacks have been defined, the substrate may be advanced to the next step in the process flow, operation 516, which may include, e.g., the addition of supporting structures including, for example, epitaxial silicon, interlayer dielectric (ILD) layers, and metal interconnects to provide for operation of the final semiconductor device.

Depending on the type of semiconductor device being manufactured, optional operations may include programming completed IC device, operation 518, for setting the functionality of the IC device.

Optional operations in some embodiments include a test/packaging operation, operation 520, during which the IC device is tested for compliance with predetermined functionality and performance parameters and/or packaged for use in the manufacture of or repair of electronic devices.

Figure 6:
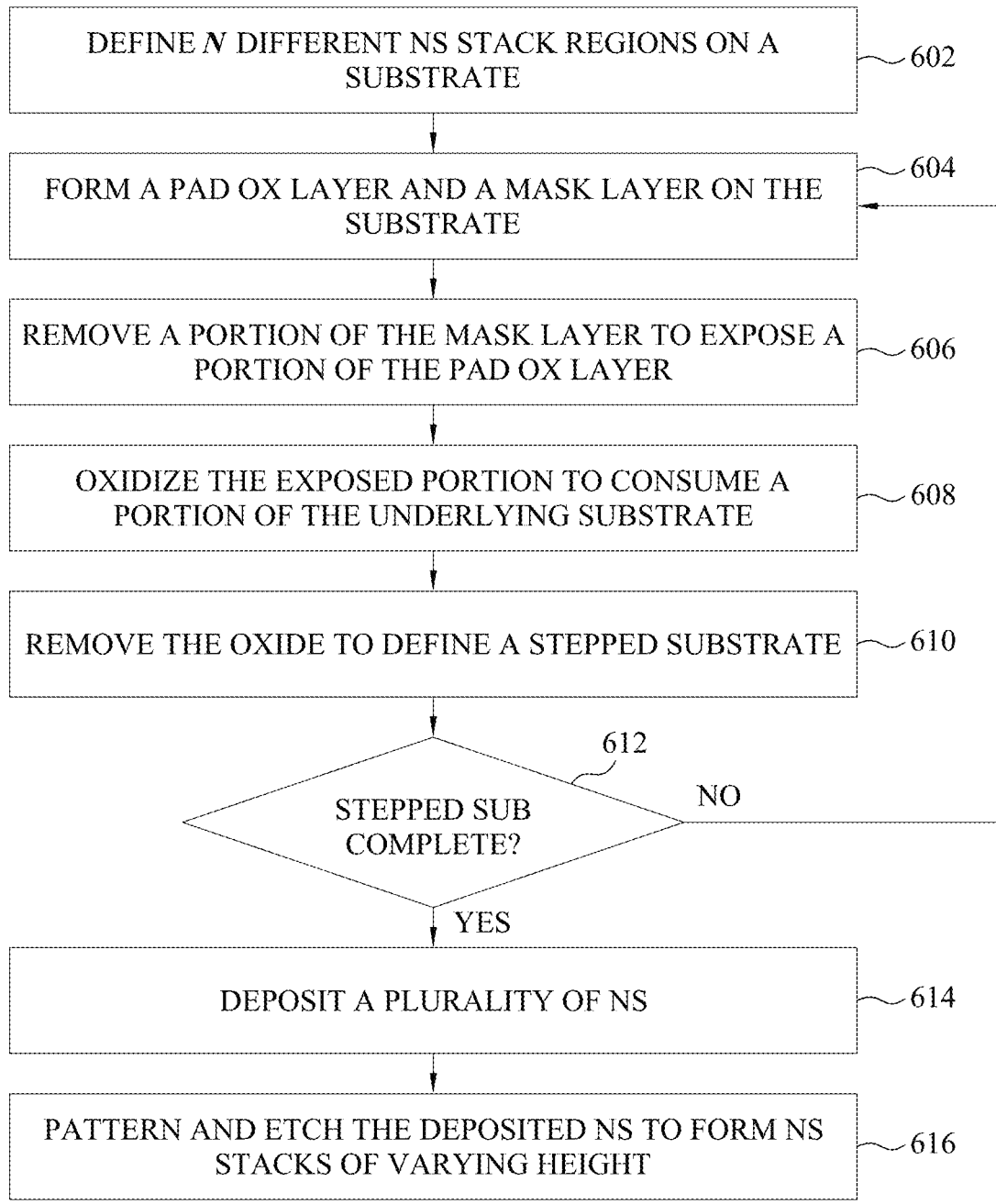
FIG. 6 is a flowchart of a method of manufacturing a GAA transistor device according to some embodiments.

FIG. 6 is a flowchart of a method 600 of manufacturing a GAA device according to some embodiments that includes, in order, the operations of defining a plurality of N nanosheet stack regions on a substrate, operation 602.

Once the nanosheet stack regions are defined, a pad oxide layer, or other suitable etch stop layer, and a mask layer are formed on the substrate, operation 604.

The mask layer is then patterned and etched to remove an unprotected portion of the mask layer and thereby form a hard mask pattern exposing a portion of the pad oxide layer and/or underlying substrate, operation 606.

The portion of the substrate underlying the pad oxide is then oxidized using, e.g., a wet or steam oxidation process, to form a thick oxide layer, operation 608.

The thick oxide layer, any residual pad oxide layer, and hard mask are then removed to expose the top surface of a stepped substrate in which the surface in the region of the substrate in which the thick oxide layer was formed is recessed or vertically offset from the surface in the region of the substrate that was protected by the hard mask during the oxidation process, operation 610.

In some embodiments, additional recessed or vertically offset regions are subsequently formed by repeating the sequence of operations 604-610, until a final stepped substrate configuration is reached and the substrate is advanced for further processing, operation 612.

A sequence of nanosheet deposition and, for some layers, partial removal of at least one nanosheet layer before a subsequent nanosheet deposition, is utilized to obtain a stepped substrate having a different number nanosheets on each recess level of the stepped substrate, operation 614.

After the desired number of partial and full nanosheet layers has been deposited, the stacks of nanosheet layers can be patterned and etched, operation 616, to form a series of nanosheet stacks having both the number of incorporated nanosheets and the width of the nanosheet stack corresponding to the requirements of the particular functional element.

Figure 7:
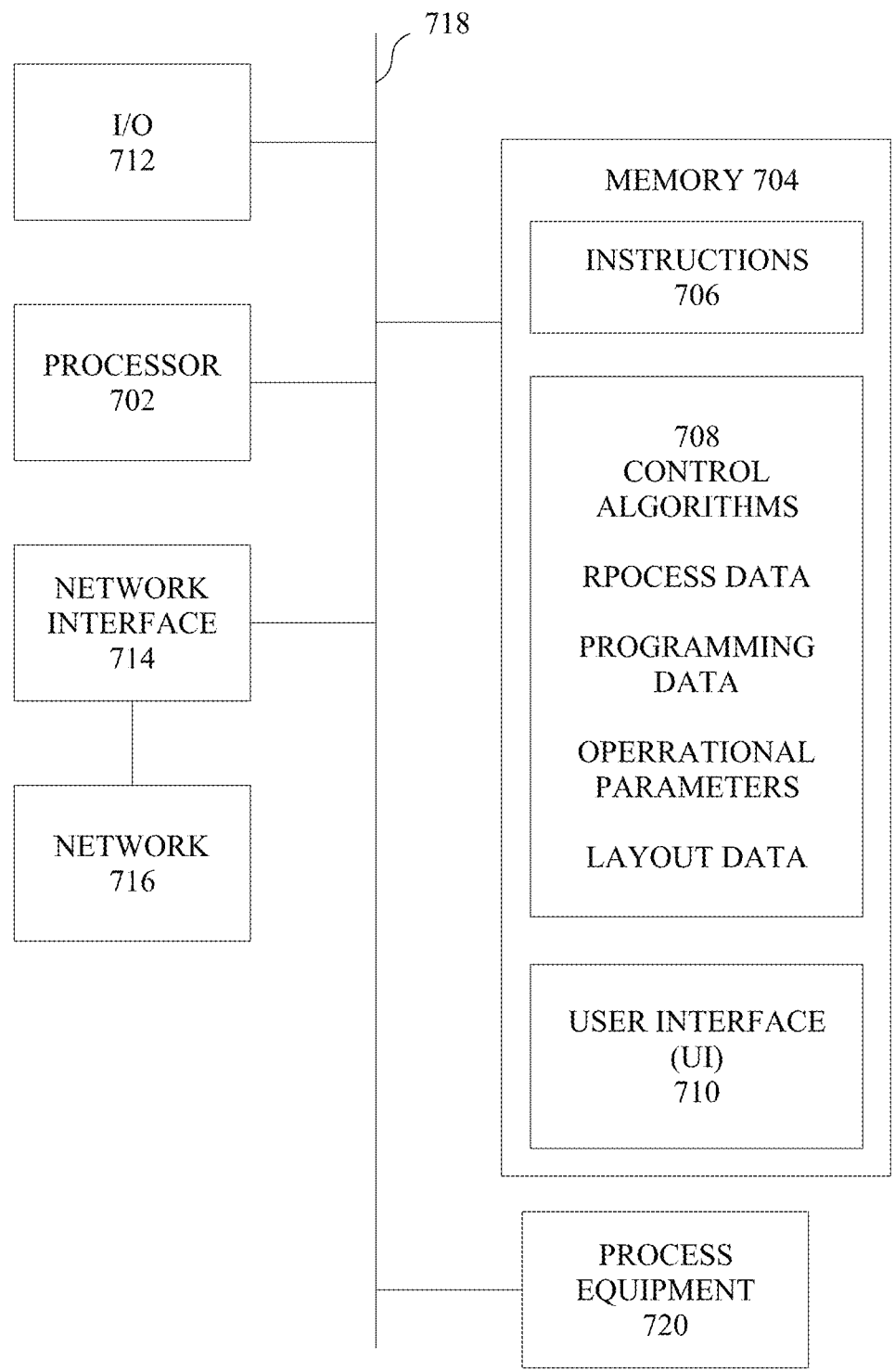
FIG. 7 is a schematic diagram of a system for manufacturing a GAA transistor devices according to some embodiments.

FIG. 7 is a block diagram of an electronic process control (EPC) system 700, in accordance with some embodiments. Methods used for generating cell layout diagrams corresponding to some embodiments of the GAA structures detailed above, particularly with respect to the addition and placement of the field plate contact on the RPO structure are implementable, for example, using EPC system 700, in accordance with some embodiments of such systems. In some embodiments, EPC system 700 is a general-purpose computing device including a hardware processor 702 and a non-transitory, computer-readable, storage medium 704. Computer-readable storage medium 704, amongst other things, is encoded with, i.e., stores, computer program code (or instructions) 706, i.e., a set of executable instructions. Execution of computer program code 706 by hardware processor 702 represents (at least in part) an EPC tool which implements at least a portion of the methods described herein in accordance with one or more of the structures and methods detailed herein.

Hardware processor 702 is electrically coupled to computer-readable storage medium 704 via a bus 718. Hardware processor 702 is also electrically coupled to an I/O interface 712 by bus 718. A network interface 714 is also electrically connected to hardware processor 702 via bus 718. Network interface 714 is connected to a network 716, so that both the hardware processor 702 and the computer-readable storage medium 704 can connect to external elements via network 716. Hardware processor 702 is configured to execute computer program code 706 encoded in computer-readable storage medium 704 to cause EPC system 700 to be usable for performing at least a portion of the noted processes and/or methods. In one or more embodiments, hardware processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause the EPC system 700 (where such execution represents (at least in part) the EPC tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores process control data 708 including, in some embodiments, control algorithms, process variables and constants, target ranges, set points, programming control data, and code for enabling statistical process control (SPC) and/or model predictive control (MPC) based control of the various processes.

EPC system 700 includes I/O interface 712. I/O interface 712 is coupled to external circuitry. In one or more embodiments, I/O interface 712 includes a keyboard, keypad, mouse, trackball, trackpad, touchscreen, and/or cursor direction keys for communicating information and commands to hardware processor 702.

EPC system 700 also includes network interface 714 coupled to hardware processor 702. Network interface 714 allows EPC system 700 to communicate with network 716, to which one or more other computer systems are connected. Network interface 714 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 700.

EPC system 700 is configured to send information to and receive information from fabrication tools 720 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 704.

EPC system 700 is configured to receive information through I/O interface 712. The information received through I/O interface 712 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 702. The information is transferred to hardware processor 702 via bus 718. EPC system 700 is configured to receive information related to a user interface (UI) through I/O interface 712. The information is stored in computer-readable medium 704 as user interface (UI) 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
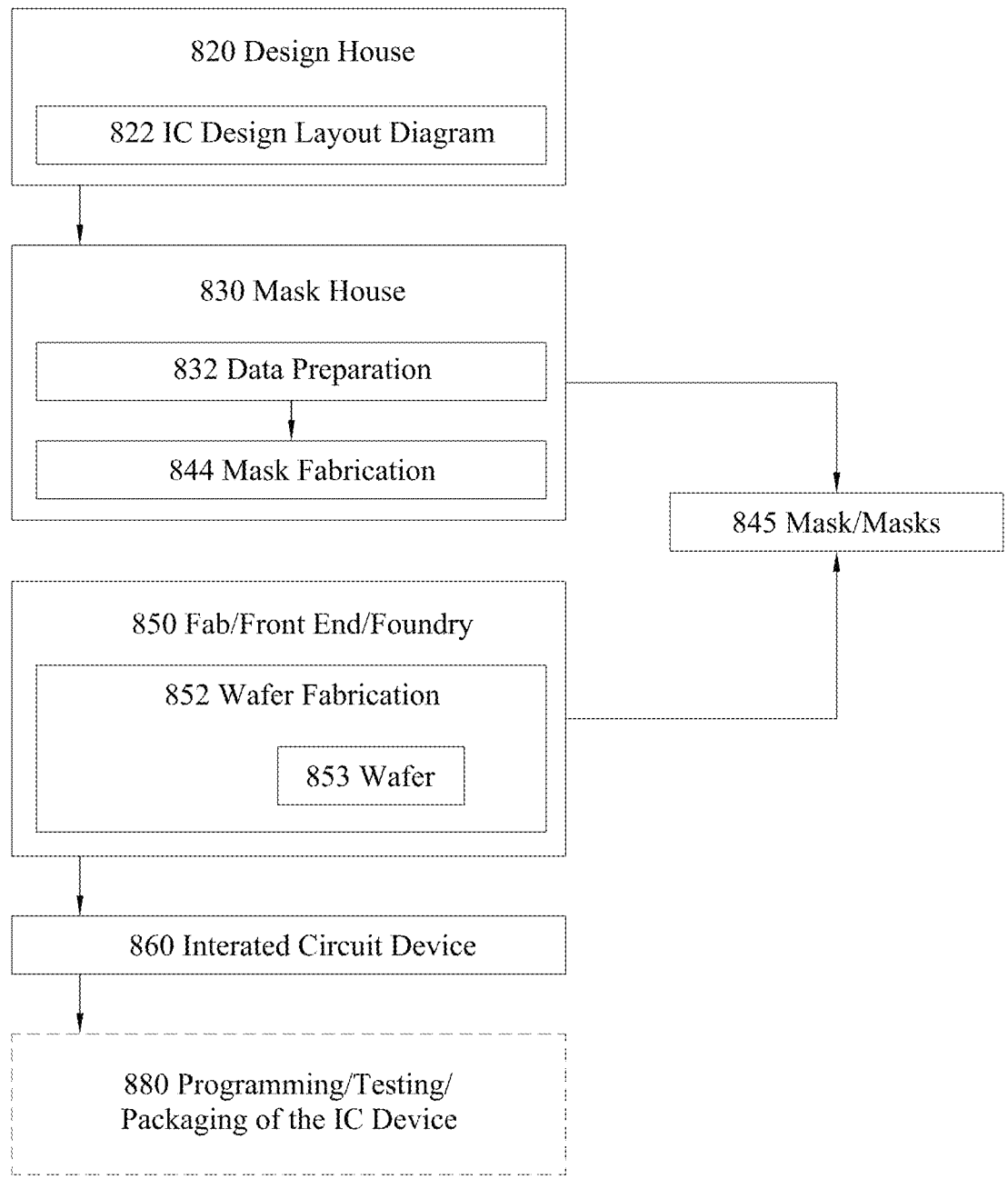
FIG. 8 is a flowchart of IC device design, manufacture, and programming of IC devices according to some embodiments.

FIG. 8 is a block diagram of an integrated circuit (IC) manufacturing system 800, and an IC manufacturing flow associated therewith, in accordance with some embodiments for manufacturing IC devices that incorporate the improved control over the SSD and EPI profile. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. Once the manufacturing process has been completed to form a plurality of IC devices on a wafer, the wafer is optionally sent to backend or back end of line (BEOL) 880 for, depending on the device, programming, electrical testing, and packaging in order to obtain the final IC device products. The entities in manufacturing system 800 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 820, mask house 830, and IC Fab 850 is owned by a single larger company. In some embodiments, two or more of design house 820, mask house 830, and IC Fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features.

For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 830 includes mask data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The IC design layout diagram 822 is manipulated by mask data preparation 832 to comply with particular characteristics of the mask writer and/or requirements of IC Fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC Fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders. After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask.

In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes. IC Fab 850 includes wafer fabrication 852. IC Fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 852 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 845 include a single layer of mask material. In some embodiments, a mask 845 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, NF$_3$, Cl$_2$, CCl$_2$F$_2$, SiCl$_4$, BCl$_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures include the nanosheets and/or gate structures of Gate All Around (GAA) devices with the gate structures being embedded in a dielectric support medium covering the sides of the gate structures. In some embodiments, the exposed portions of the gate structures of the functional area are top surfaces and sides of the gate structures that are above a top surface of the dielectric support medium, where the top surface of the dielectric support medium has been recessed to a level below the top surface of the nanosheet stacks, but still covering a lower portion of the sides of the nanosheet stacks.

IC Fab 850 uses mask(s) 845 fabricated by mask house 830 to fabricate IC device 860. Thus, IC Fab 850 at least indirectly uses IC design layout diagram 822 to fabricate IC device 860. In some embodiments, semiconductor wafer 853 is fabricated by IC Fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Figure 9:
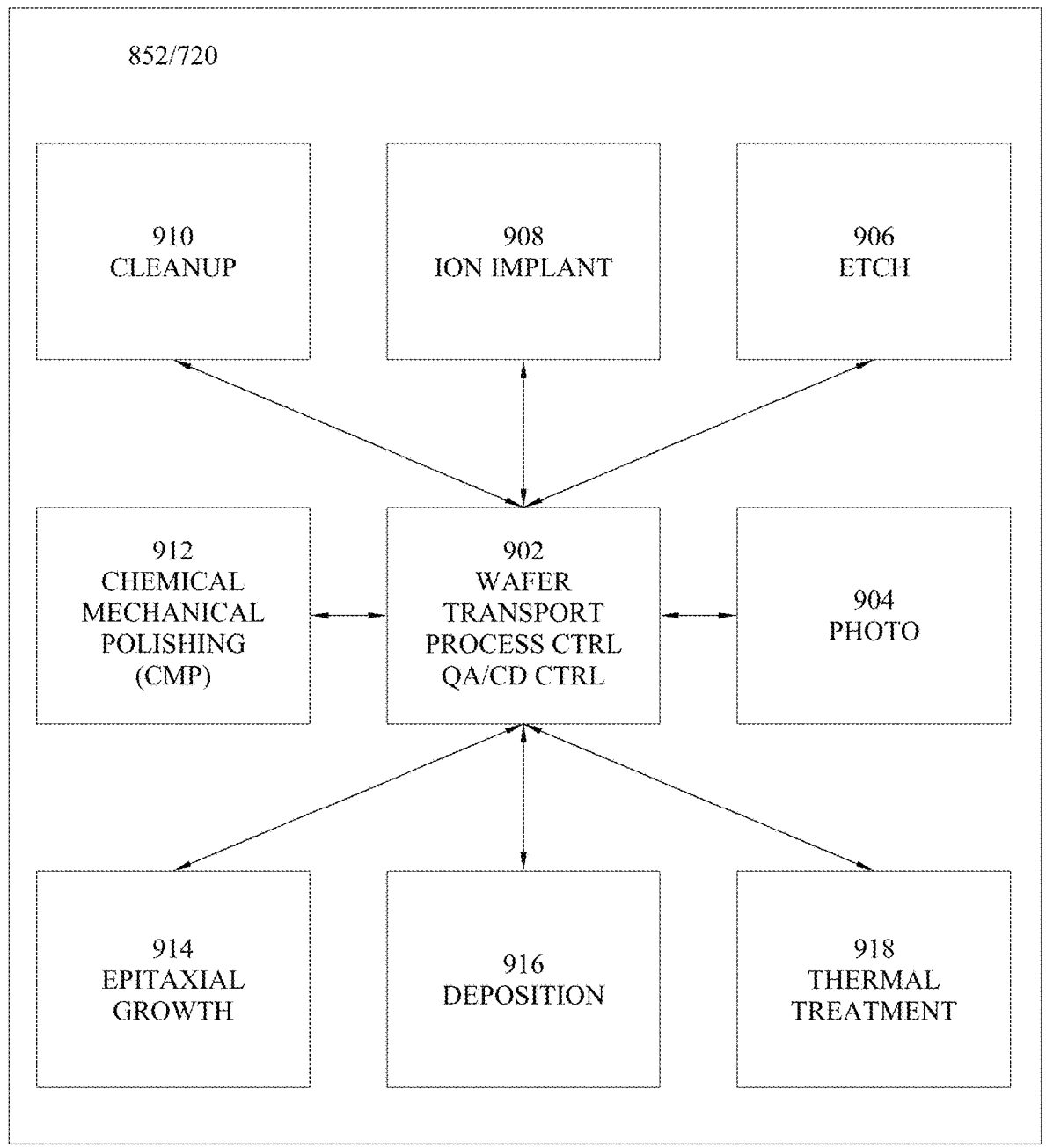
FIG. 9 is a schematic diagram of a processing system for manufacturing GAA transistor devices according to some embodiments.

FIG. 9 is a schematic diagram of various processing departments defined within a Fab/Front End/Foundry for manufacturing IC devices according to some embodiments as suggested in FIG. 7, specifically in blocks 708 and 720 and FIG. 8, specifically in block 850. The processing departments utilized in front end of line (FEOL) IC device manufacturing typically include a wafer transport operation 902 for moving the wafers between the various processing departments. In some embodiments, the wafer transport operation will be integrated with an electronic process control (EPC) system according to FIG. 10 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 902 will be the various processing departments providing, for example, photolithographic operations 904, etch operations 906, ion implant operations 908, clean-up/strip operations 910, chemical mechanical polishing (CMP) operations 912, epitaxial growth operations 914, deposition operations 916, and thermal treatments 918.

Additional details regarding integrated circuit (IC) manufacturing systems and an IC manufacturing flows associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, each of which are hereby incorporated, in their entireties, by reference.

Semiconductor devices according to some embodiments include a substrate; a first transistor formed over a first portion of the substrate, wherein the first transistor comprises a first nanosheet stack of N nanosheets, a second transistor formed over a second portion of the substrate, wherein the second transistor comprises a second nanosheet stack of M nanosheets, and wherein N is different from M.

In semiconductor devices according to other embodiments, the semiconductor device includes one or more additional elements including, for example, an isolation region separating the first transistor and the second transistor, an isolation region comprising a dielectric structure extending into the substrate between the first and second transistors, embodiments in which both N and M are integers and each have a value of from 1 to 5, embodiments in which an upper surface of the first portion of the substrate defines a first plane and an upper surface of the second portion of the substrate defines a second plane, wherein a first vertical offset exists between the first plane and the second plane, embodiments in which the first vertical offset is within a range of 10-60 nm and N and M satisfy the relationship N<M, in which the first vertical offset distance is at most twice a thickness of a single nanosheet, a third transistor over a third portion of the substrate, the third transistor including a third nanosheet stack of O nanosheets, wherein O is different from each of N and M, an upper surface of the third portion of the substrate defines a third plane, with a second vertical offset distance existing between the second plane and the third plane.

In some embodiments, methods of manufacturing such semiconductor devices include the operations of forming a mask pattern on a top surface of a first portion of a semiconductor substrate, oxidizing an unmasked second portion of the semiconductor substrate to form an oxide layer over the second portion of the semiconductor substrate, removing the oxide layer to expose a top surface of the second portion of the semiconductor substrate, removing the mask pattern to expose the top surface of the first portion of the semiconductor substrate, wherein the top surface of the second portion of the semiconductor substrate is vertically recessed by an offset distance relative to the top surface of the first portion of the semiconductor substrate, depositing a first layer of a first material on the top surfaces of the first and second portions of the semiconductor substrate, depositing a first layer of a second material on the layer of the first material over the first and second portions of the semiconductor substrate, masking the first and second materials over the second portion of the semiconductor substrate, removing the first and second materials over the first portion of the semiconductor substrate, depositing a second layer of the first material and a second layer of the second material on the top surface of the first portion of the semiconductor substrate and a top surface of a residual portion of the first and second materials on the second portion of the semiconductor substrate, and patterning and etching the first and second materials to form a first stack having a height H$_1$ over the first portion of the semiconductor substrate and a second stack having a height $H_2$ over the second portion of the semiconductor substrate, wherein $H_1$ and $H_2$ satisfy a relationship $H_2>H_1$.

In some embodiments, methods of manufacturing such semiconductor devices include one or more additional operations including, for example, depositing the first layer of the first material on the top surfaces of the first and second portions of the semiconductor substrate comprises depositing a material having a first etch rate $R_1$, depositing the first layer of the second material on the layer of the first material over the first and second portions of the semiconductor substrate comprises depositing a material having a second etch rate $R_2$, wherein $R_1$ and $R_2$ satisfy a relationship $R_1 \ll R_2$, removing the first material from the first and second stacks, forming a gate dielectric layer (not shown) on the second material in the first and second stacks, oxidizing an unmasked second portion of the semiconductor substrate to form an oxide layer having a first thickness with a ratio of the first thickness to the offset distance being 2:1, oxidizing a thickness of the second portion of the semiconductor substrate whereby the offset distance approximates a difference in the heights $H_1$ and $H_2$.

In some embodiments, methods of manufacturing such semiconductor devices include one or more additional operations including, for example, identifying a plurality of functional blocks on a semiconductor substrate, determining a power/speed target for each of the functional blocks, identifying a plurality of nanosheet stack configurations for achieving each of the power/speed targets, and forming the identified nanosheet stack configuration on a portion of the semiconductor substrate corresponding to each functional block, identifying a plurality of nanosheet stack configurations includes identifying a first nanosheet stack configuration of N nanosheets and a second nanosheet stack configuration of M nanosheets, wherein N≠M, identifying a plurality of nanosheet stack configurations includes identifying a first nanosheet stack configuration having a first width $W_1$ and a second nanosheet stack configuration having a second width $W_2$, wherein $W_1 \neq W_2$, identifying a plurality of nanosheet stack configurations includes identifying the first nanosheet stack configuration having a first width $W_1$ and the second nanosheet stack configuration having a second width $W_2$, wherein $W_1 \neq W_2$ and wherein N≠M, identifying a plurality of nanosheet stack configurations includes identifying the first nanosheet stack configuration of N nanosheets and the second nanosheet stack configuration of M nanosheets, wherein N and M are both integers having values of at least 2 and further wherein a difference between N and M is at least 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of some embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, comprising:
   forming a mask pattern on a top surface of a first portion of a semiconductor substrate;
   oxidizing an unmasked second portion of the semiconductor substrate to form an oxide layer over the second portion of the semiconductor substrate;
   removing the oxide layer to expose a top surface of the second portion of the semiconductor substrate;
   removing the mask pattern to expose the top surface of the first portion of the semiconductor substrate, wherein the top surface of the second portion of the semiconductor substrate is vertically recessed by an offset distance relative to the top surface of the first portion of the semiconductor substrate;
   depositing a first layer of a first material on the top surfaces of the first and second portions of the semiconductor substrate;
   depositing a first layer of a second material on the layer of the first material over the first and second portions of the semiconductor substrate;
   masking the first and second materials over the second portion of the semiconductor substrate;
   removing the first and second materials over the first portion of the semiconductor substrate;
   depositing a second layer of the first material and a second layer of the second material on the top surface of the first portion of the semiconductor substrate and a top surface of a residual portion of the first and second materials on the second portion of the semiconductor substrate; and
   patterning and etching the first and second materials to form a first stack having a height $H_1$ over the first portion of the semiconductor substrate and a second stack having a height $H_2$ over the second portion of the semiconductor substrate, wherein $H_1$ and $H_2$ satisfy a relationship $H_2>H_1$.

2. The method according to claim 1, wherein
   depositing the first layer of the first material on the top surfaces of the first and second portions of the semiconductor substrate comprises depositing a material having a first etch rate $R_1$; and
   depositing the first layer of the second material on the layer of the first material over the first and second portions of the semiconductor substrate comprises depositing a material having a second etch rate $R_2$, wherein $R_1$ and $R_2$ satisfy a relationship $R_1 \ll R_2$.

3. The method according to claim 2, further comprising:
   removing the first material from the first and second stacks.

4. The method according to claim 3, further comprising:
   forming a gate dielectric layer on the second material in the first and second stacks.

5. The method according to claim 1, further comprising:
   oxidizing an unmasked second portion of the semiconductor substrate to form an oxide layer having a first thickness with a ratio of the first thickness to the offset distance being 2:1.

6. The method according to claim 1, further comprising:
   oxidizing a thickness of the second portion of the semiconductor substrate whereby the offset distance approximates a difference in the heights $H_1$ and $H_2$.

7. A method of making a semiconductor device, comprising:
   identifying a plurality of functional blocks on a semiconductor substrate;
   determining a power/speed target for each of the functional blocks;
   identifying a plurality of nanosheet stack configurations for achieving each of the power/speed targets; and forming the identified nanosheet stack configuration on a portion of the semiconductor substrate corresponding to each functional block, wherein forming the identified nanosheet stack configuration comprises forming a mask pattern that protects a top surface of a first functional block and exposes a top surface of a second functional block;

oxidizing the exposed top surface of the second functional block to form an oxide layer over the second functional block;

removing the oxide layer to expose a recessed top surface of the second functional block;

removing the mask pattern to expose the top surface of the first functional block, wherein the recessed top surface of the second functional block is vertically recessed by an offset distance relative to the top surface of the first functional block;

depositing a first layer of a first material on the top surface of the first functional block and the recessed top surface of the second functional block;

depositing a first layer of a second material on the top surface of the first layer of the first material over the first and second portions of the semiconductor substrate first functional block and the recessed top surface of the second functional block;

masking the first layers of the first and second materials over the second functional block;

removing the first layers of the first and second materials from over the top surface of the first functional block;

depositing a second layer of the first material and a second layer of the second material on the top surface of the first functional block and on a top surface of a residual portion of the first and second materials above the second functional block; and patterning and etching the second layer of the first and second materials to form a first stack having a height $H_1$ over the first functional block and a second stack having a height $H_2$ over the second functional block, wherein $H_1$ and $H_2$ satisfy a relationship $H_2 > H_1$.

8. The method of claim 7, wherein:

identifying a plurality of nanosheet stack configurations includes identifying a first nano sheet stack configuration of N nano sheets and a second nano sheet stack configuration of M nanosheets, wherein N≠M.

9. The method of claim 7, wherein:

identifying a plurality of nanosheet stack configurations includes identifying a first nanosheet stack configuration having a first width $W_1$ and a second nanosheet stack configuration having a second width $W_2$, wherein $W_1 \neq W_2$.

10. The method of claim 8, wherein:

identifying a plurality of nanosheet stack configurations includes identifying the first nanosheet stack configuration having a first width $W_1$ and the second nanosheet stack configuration having a second width $W_2$, wherein $W_1 \neq W_2$ and wherein N≠M.

11. The method of claim 8, wherein:

identifying a plurality of nanosheet stack configurations includes identifying the first nano sheet stack configuration of N nano sheets and the second nano sheet stack configuration of M nanosheets, wherein N and M are both integers having values of at least 2 and further wherein a difference between N and M is at least 2.

12. A method of making a semiconductor device, comprising:

identifying a plurality of functional blocks on a semiconductor substrate;

identifying a nanosheet stack configuration from a plurality of nanosheet stack configurations for achieving each of the functional blocks; and forming each of the identified nanosheet stack configurations on a portion of the semiconductor substrate corresponding to each functional block, wherein forming the identified nanosheet stack configuration further comprises forming a first mask pattern that protects a top surface of a first functional block and exposes a top surface of a second functional block and a top surface of a third functional block;

oxidizing the exposed top surfaces of the second functional block and third functional block to form a first oxide layer over the second functional block and third functional block;

removing the first oxide layer to expose a recessed top surface of the second functional block and the third functional block;

removing the first mask pattern;

forming a second mask pattern that protects a top surface of the first functional block and the second functional block and exposes a top surface of the third functional block;

oxidizing the exposed top surface of the third functional block to form a second oxide layer over the third functional block;

removing the second oxide layer to expose a double recessed top surface of the third functional block;

removing the second mask pattern;

wherein the recessed top surface of the second functional block is vertically recessed by a first offset distance $D_1$ relative to the top surface of the first functional block and the double recessed top surface of the third functional block is vertically recessed by a second offset distance $D_2$ relative to the top surface of the first functional block and;

sequentially depositing alternating layers of a first material and a second material over the top surfaces of the first, second, and third functional blocks;

masking and etching predetermined regions of the alternating layers of the first material and the second material;

repeating the sequentially depositing and masking and etching operations until a first nanosheet stack configuration having a height $H_1$ has been formed over the first functional block, a second nanosheet stack configuration having a height $H_2$ has been formed over the second functional block, and a third nanosheet stack configuration having a height $H_3$ has been formed over the third functional block, wherein $H_1$, $H_2$, and $H_3$ satisfy a relationship $H_3 > H_2 > H_1$.

13. The method of claim 12, further comprising:

masking and etching the first, second, and third nanosheet stack configurations to form separate first, second, and third nanosheet stacks.

14. The method of claim 12, further comprising:

masking and etching the first, second, and third nanosheet stack configurations to form a first nanosheet stack having a first surface area $A_1$, a second nanosheet stack having a second surface area $A_2$, and third nanosheet stack having a third surface area $A_3$, wherein the first, second, and third surface areas satisfy a first expression $A_1 \neq A_2$ and a second expression $A_1 \neq A_3$.

15. The method of claim 12, further comprising:
masking and etching the first, second, and third nanosheet stack configurations to form a first nanosheet stack having $N_1$ nanosheets, a second nanosheet stack having $N_2$ nanosheets, and third nanosheet stack having $N_3$ nanosheets, wherein the first, second, and third numbers of nanosheets satisfy a first expression $N_1 \neq N_2$ and a second expression $N_1 \neq N_3$.

16. The method of claim 12, further comprising:
determining a power/speed target for each of the functional blocks;
determining a nanosheet stack height and a nanosheet stack area to define a plurality of nanosheet stack designs sufficient satisfy the power/speed target for each of the functional blocks; and
forming a designated nanosheet stack design on each of the corresponding functional blocks.

17. The method of claim 12, further comprising:
oxidizing the exposed top surfaces of the second functional block and third functional block to form a first oxide layer having a first thickness $T_1$ over the second functional block and third functional block; and
oxidizing the exposed top surface of the third functional block to form a second oxide layer having a second thickness $T_2$ over the third functional block, wherein the first and second thicknesses satisfy a relationship $T_1 \approx T_2$.

18. The method of claim 12, further comprising:
oxidizing the exposed top surfaces of the second functional block and third functional block to form a first oxide layer having a first thickness $T_1$ over the second functional block and third functional block; and
oxidizing the exposed top surface of the third functional block to form a second oxide layer having a second thickness $T_2$ over the third functional block, wherein the first and second thicknesses satisfy a relationship $T_1 \neq T_2$.

19. The method of claim 16, further comprising:
determining a power/speed target for each of the functional blocks;
determining a nanosheet stack height, a nanosheet stack width, and a nanosheet stack length to define a plurality of nanosheet stack designs sufficient satisfy the power/speed target for each of the functional blocks; and
forming a designated nanosheet stack design on each of the corresponding functional blocks.

20. The method of claim 16, further comprising:
determining a power/speed target for each of the functional blocks;
determining a nanosheet stack height and a nanosheet stack width to define a plurality of nanosheet stack designs having a fixed nanosheet length sufficient satisfy the power/speed target for each of the functional blocks; and
forming a designated nanosheet stack design on each of the corresponding functional blocks.

* * * * *